United States Patent [19]

Birkle et al.

[11] Patent Number: 5,037,876
[45] Date of Patent: Aug. 6, 1991

[54] PLANARIZING DIELECTRIC

[75] Inventors: Siegfried Birkle, Hoechstadt A/Aisch; Albert Hammerschmidt, Erlangen; Johann Kammermaier, Unterhaching; Rainer Leuschner, Grossenseebach; Rolf-W. Schulte, Erlangen, all of Fed. Rep. of Germany

[73] Assignee: Siemens Aktiengesellschaft, Berlin & Munich, Fed. Rep. of Germany

[21] Appl. No.: 504,931

[22] Filed: Apr. 5, 1990

[30] Foreign Application Priority Data

Apr. 27, 1989 [DE] Fed. Rep. of Germany ....... 3913981

[51] Int. Cl.$^5$ .......................... C08J 3/04; C08K 3/04; C08L 3/04
[52] U.S. Cl. .................... 524/496; 524/495
[58] Field of Search ............... 524/496, 611, 606, 495; 528/183

[56] References Cited

U.S. PATENT DOCUMENTS 3,700,597 10/1972 Kastenbein et al. ................ 524/404
4,738,999 4/1988 Blenner et al. ...................... 524/590
4,845,183 7/1989 Mueller et al. ...................... 528/183

FOREIGN PATENT DOCUMENTS 0145202 8/1984 Japan .................................. 524/404

OTHER PUBLICATIONS

"A Novel Multilevel Metallization Technique for Advanced CMOS and Bioplar Integrated Circuits", V. Grewal et al., Jun. 9-10, 1986 V-MIC Conf., pp. 107-113.

"Polyimide Planarization in Integrated Circuits", appearing in K. L. Mittal, Polyimides, vol. 2, pp. 767-793, Plenum Press New York, 1984.

Primary Examiner—Paul R. Michl
Assistant Examiner—U. K. Rajguru
Attorney, Agent, or Firm—Kenyon & Kenyon

[57] ABSTRACT

A planarizing dielectric, which is particularly suitable for electronic components, fulfills the required properties to a high degree when it comprises a matrix of a high-temperature resistant, organic polymer, into which matrix is intercalated in fine distribution a solid filler material, which is etchable in oxygen plasma, has high thermal conductivity and good dielectric properties.

20 Claims, No Drawings

PLANARIZING DIELECTRIC

FIELD OF THE INVENTION

The invention concerns a planarizing dielectric, in particular for electronic components.

BACKGROUND OF THE INVENTION

High-temperature resistant, organic dielectrics are frequently used for planarizing the topography in electronic components (c.f. e.g.: K. L. Mittal, *Polyimides*, Vol. 2, pp 767 to 793, Plenum Press New York, 1984). They are applied from solutions e.g. by means of spin coating or spray coating. In addition to good planarizing and dielectric properties, a low dielectric constant, which enables a high operating speed, and a low dissipation factor at high thermal conductivity are thereby required in order to be able to realize high packing densities. Moreover, a structurability of the dielectric must be guaranteed.

The said requirements, in particular with regard to a high thermal conductivity, are unable to be fulfilled by the planarizing organic dielectrics which are available from today's outlook for microelectronics. Therefore, the uses for planarizing organic dielectrics in developing integrated circuits with high packing density are sharply restricted. On the other hand, inorganic layers or dielectrics alternatively used for planarizing, e.g. of $SiO_2$ (c.f.: V. Grewal et al., June 9–10, 1986 V-MIC Conf. pp 107 to 113), which are deposited from the gaseous phase, require complicated technology. Moreover, although a high thermal conductivity can indeed be achieved with these dielectrics, they have distinctly worse dielectric properties than the organic dielectrics.

It is an object of the invention to specify a planarizing dielectric which has both good planarizing and dielectric properties as well as a low dielectric constant, a low dissipation factor and a high thermal conductivity.

It is a further object of the invention to specify a planarizing dielectric having such properties which is structurable.

SUMMARY OF THE INVENTION

The planarizing dielectric of the invention is a matrix of a high-temperature resistant organic polymer having a fine distribution of a solid filler material intercalated therein. The filler material is etchable in oxygen plasma and has a high thermal conductivity and good dielectric properties.

DETAILED DESCRIPTION OF THE INVENTION

In the object of the invention the dielectric and also the planarizing properties of the plastic matrix are only marginally influenced by the filler material, whereas the thermal conductivity is decidedly increased. The filler material is electrically non-conducting, i.e. insulating (specific resistance $> 10^{10} \Omega$.cm). Moreover, the etchability of the dielectric in an oxygen plasma is not impaired by the filler material.

In the planarizing dielectric according to the invention, the filler material constituent advantageously amounts up to 30 Vol. %. The filler material can e.g. be diamond, whose specific electrical resistance amounts to approx. $10^{16} \Omega$.cm. However, the filler material preferably is an amorphous, hydrogenated carbon.

Amorphous, hydrogenated carbon (for short "a-C:H") is a carbon material in which an amorphous carbon lattice is present. Due to its mechanical hardness, this carbon material is also designated as a diamond-like carbon (c.f. e.g.: *IDR -Industrie Diamanten Rundschau*, Vol 18 (1984), No. 4, pp 249 to 253). This modification of carbon gets its special properties like optical transparency, microhardness, chemical resistance and electrical insulation through the juxtaposition of tetrahedral ($sp^3$-) and trigonal ($sp^2$-) hybridization; the amorphous structure is stabilized by the incorporation of hydrogen (approx. 10 to 40 atom-%). Layers of amorphous hydrogenated carbon have good electrical insulation; namely, the specific electrical resistance of this material can be standardized up to over $10^{13} \Omega$.cm.

Amorphous, hydrogenated carbon can be prepared by means of a high- frequency, low pressure plasma precipitation of gaseous hydrocarbons. Thereby the properties of the a-C:H such as dielectric constant and specific electrical resistance are able to be controlled within a relative broad range by the plasma conditions. If the a-C:H is deposited e.g. by means of a low- pressure plasma using capacitive coupling of radio frequency energy (13.56 MHz), while using methane, at a gas pressure of 2 mbar and a self-bias voltage $\geq 150$ V, then one obtains a transparent material with an optical mobility energy gap of approximately 2 eV, a specific electrical resistance $> 10^{12} \Omega$.cm, a dielectric constant of 6 and a thermal conductivity of approximately 1000 W/K.m.

The etchability of the entire system in $O_2$-plasmas is not impaired by the chemical structure of a-C:H. Due to the optical properties of a-C:H, i.e. the transparency, the possibility of a direct structuring in a lithographic process also emerges, alongside of the indirect photo-structuring by means of a silicon-containing top resist. The use of a material with an amorphous structure like a-C:H as filler material is also therefore particularly advantageous in the dielectric according to the invention because the etching process takes place isotropically in the case of the direct structuring. Further, it is advantageous in the object of the invention when the filler material, which is used in a powdered form, has a particle size of $< 50$ nm.

In the dielectric according to the invention, the plastic matrix consists advantageously of so-called ladder or semi-ladder polymers, which are resistant to high temperatures. Ladder polymers are high polymers whose molecules consist of chains of condensed rings so that their structure resembles the image of a runged ladder. These types of polymers are polyimidazopyrrolones, for example. Semi-ladder polymers are polyimides, polyimidazoles and polyoxazoles, for example. The plastic matrix in the dielectric according to the invention preferably consist of a polybenzoxazole (c.f. e.g.: E. Behr, Hochtemperaturbeständige Kunststoffe ("High-Temperature Resistant Plastics"), Carl Hanser Verlag, Munich, 1969, pp 71-72 as well as 99–100).

The invention shall be more closely explained in light of the following exemplified embodiment.

EXAMPLE 1

A polybenzoxazole which has a thermal conductivity of 0.19 W/K.m serves as a plastic matrix; the dielectric constant amounts to 2.8. A soluble precursor of the polybenzoxazole in the form of a hydroxypolyamide is prepared from 2,2-bis(3-amino-4-hydroxyphenyl)-1,1,1,3,3,3-hexafluoro propane (50 mole %), 3,3'-dihydroxybenzidine (50 mole %) and isophthalic acid dichloride (90 mole %) (c.f.: *Polymer Letters,* Vol. 2 (1964), pp 655 to 659).

Powdered, amorphous, hydrogenated carbon, preferably having a particle size of <50 nm, is dispersed in an approx. 20 to 30% solution of the polybenzoxazole precursor in Nmethylpyrrolidone. This carbon has a specific electrical resistance of $>10^{12}\Omega.\text{cm}$, a dielectric constant of 6 and a thermal conductivity of 1000 W/K.m.

The dispersion obtained in the manner described above is spun out onto silicon wafers having aluminum printed conductors. This product is then pre-dried in a forced-air oven at approx. 100° C. (duration: approx. 20 min.). The product is subsequently annealed in the diffusion oven using nitrogen as an inert gas, whereby the following temperature program is run through: 1 hour to 170° C., 1 hour to 250° C., 1 hour to 400° C., 1 hour at 400° C., 6 hours to room temperature. During the annealing process, the polymer precursor is converted into a high-temperature resistant polybenzoxazole.

Through the addition of a-C:H in a volumetric proportion up to 30% (of the solids), the dielectric constant of the dielectric increases slightly from 2.8 to 3.5; whereas the thermal conductivity is increased from 0.19 W/K.m to 1.5 to 2 W/K.m. The thermal conductivity is thus decidedly increased, whereas the dielectric as well as the planarizing properties of the dielectric are only marginally altered by the a-C:H filler material.

What is claimed is:

1. A planarizing dielectric, in particular for electronic components, comprising a matrix of a high-temperature resistant organic polymer having intercalated therein a fine distribution of a solid filler material which is etchable in an oxygen plasma and has high thermal conductivity and good dielectric properties, the solid filler material being selected from the group consisting of diamond and amorphous, hydrogenated carbon.

2. A planarizing dielectric according to claim 1 wherein said filler material amounts up to 30 Vol.-% of said dielectric.

3. A planarizing dielectric according to claim 1 wherein said filler material is an amorphous, hydrogenated carbon.

4. A planarizing dielectric according to claim 1 wherein said filler material has a particle size of <50 nm.

5. A planarizing dielectric according to claim 1 wherein the polymer is selected from the group consisting of ladder polymers and semi-ladder polymers.

6. A planarizing dielectric according to claim 5 wherein the polymer is a polybenzoxazole.

7. A planarizing dielectric according to claim 2 wherein said filler material is an amorphous hydrogenated carbon.

8. A planarizing dielectric according to claim 2 wherein said filler material has a particle size of <50 nm.

9. A planarizing dielectric according to claim 3 wherein said filler material has a particle size of <50 nm.

10. A planarizing dielectric according to claim 7 wherein said filler material has a particle size of <50 nm.

11. A planarizing dielectric according to claim 2 wherein the polymer is selected from the group consisting of ladder polymers and semi-ladder polymers.

12. A planarizing dielectric according to claim 3 wherein the polymer is selected from the group consisting of ladder polymers and semi-ladder polymers.

13. A planarizing dielectric according to claim 4 wherein the polymer is selected from the group consisting of ladder polymers and semi-ladder polymers.

14. A planarizing dielectric according to claim 7 wherein the polymer is selected from the group consisting of ladder polymers and semi-ladder polymers.

15. A planarizing dielectric according to claim 10 wherein the polymer is selected from the group consisting of ladder polymers and semi-ladder polymers.

16. A planarizing dielectric according to claim 2 wherein the polymer is a polybenzoxazole.

17. A planarizing dielectric according to claim 3 wherein the polymer is a polybenzoxazole.

18. A planarizing dielectric according to claim 4 wherein the polymer is a polybenzoxazole.

19. A planarizing dielectric according to claim 7 wherein the polymer is a polybenzoxazole.

20. A planarizing dielectric according to claim 10 wherein the polymer is a polybenzoxazole.

* * * * *